United States Patent [19]
Okayasu

[11] Patent Number: 5,764,598
[45] Date of Patent: Jun. 9, 1998

[54] DELAY TIME MEASUREMENT APPARATUS FOR DELAY CIRCUIT

[75] Inventor: Toshiyuki Okayasu, Kurihashi-machi, Japan

[73] Assignee: Advantest Corp., Tokyo, Japan

[21] Appl. No.: 729,351

[22] Filed: Oct. 16, 1996

[30] Foreign Application Priority Data

Oct. 24, 1995 [JP] Japan ................................ 7-300620

[51] Int. Cl.$^6$ ........................................ G04F 8/00
[52] U.S. Cl. ........................................ 368/120; 368/117
[58] Field of Search ........................ 368/113–120

[56] References Cited

U.S. PATENT DOCUMENTS

| | | | |
|---|---|---|---|
| 4,678,345 | 7/1987 | Agoston | 368/119 |
| 4,688,947 | 8/1987 | Blaes et al. | 368/120 |
| 4,982,387 | 1/1991 | Trent | 368/117 |
| 5,459,402 | 10/1995 | ueno et al. | 368/120 |
| 5,521,557 | 5/1996 | Yamashita et al. | 331/11 |

Primary Examiner—Bernard Roskoski
Attorney, Agent, or Firm—Muramatsu & Associates

[57] ABSTRACT

A delay time measurement apparatus of delay circuit is configured to minimize the influence of periodic noises for accurately measuring the delay time. The delay time measurement apparatus includes: a voltage controlled oscillator (VCO) whose oscillation frequency is controlled by a given voltage; a phase comparator having two inputs for comparing a phases difference between signals at the two inputs where one of the inputs receives an output of the VCO through a delay circuit whose delay time is to be measured and the other input directly receives the output of the voltage controlled oscillator; a phase lock loop having the VCO and the phase comparator therein to return an output voltage of the phase comparator to the VCO to control an oscillation frequency such that the phase difference between the two inputs of the phase comparator becomes zero; a signal adder for introducing an external signal into the phase lock loop for fluctuating the oscillation frequency, where the external signal is a signal whose average voltage level for an integer multiple of one cycle is zero; and a counter for counting the oscillation frequency of the VCO.

20 Claims, 9 Drawing Sheets

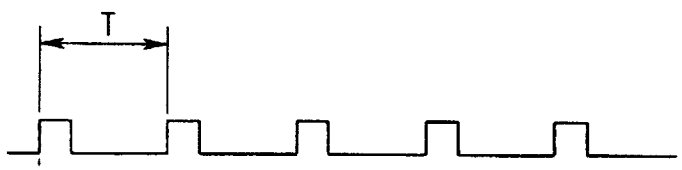
FIG.4A1
FIG.4A2
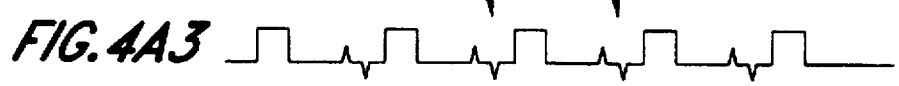
FIG.4A3
FIG.4A4
FIG.4B1
FIG.4B2
FIG.4B3
FIG.4B4
FIG.4B5
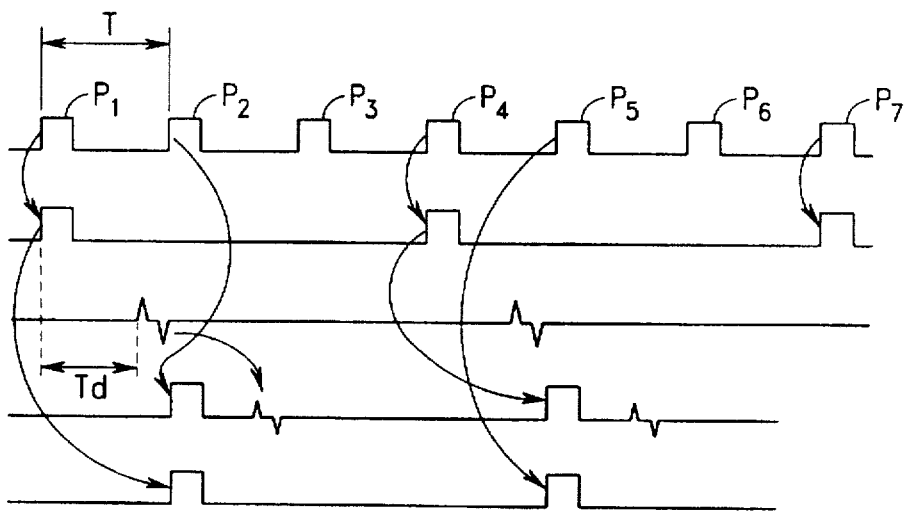

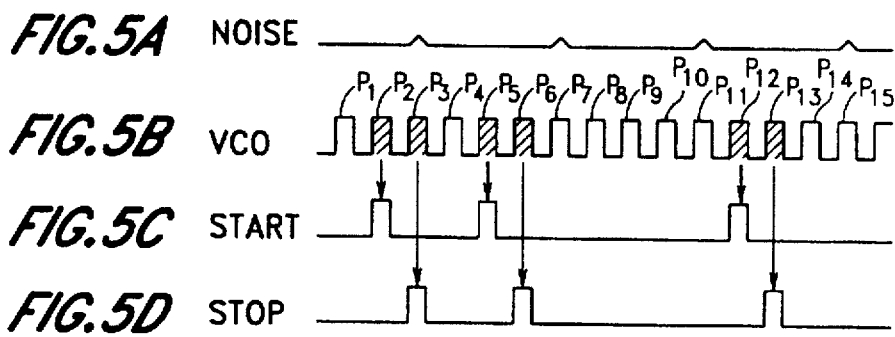
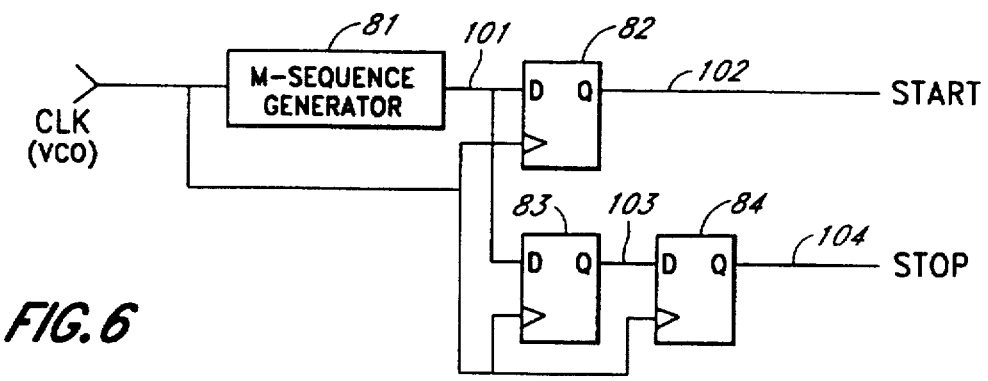
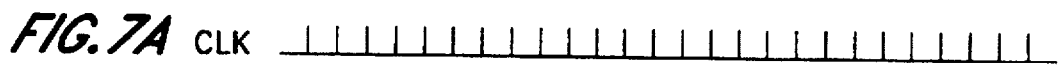
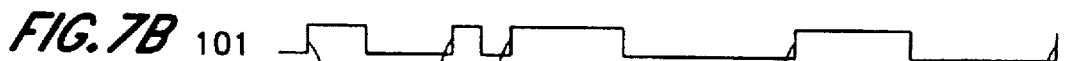
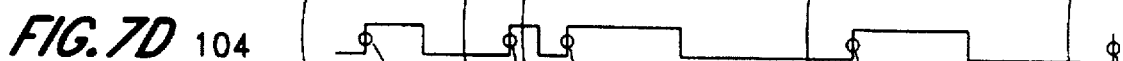
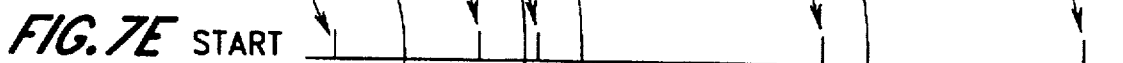
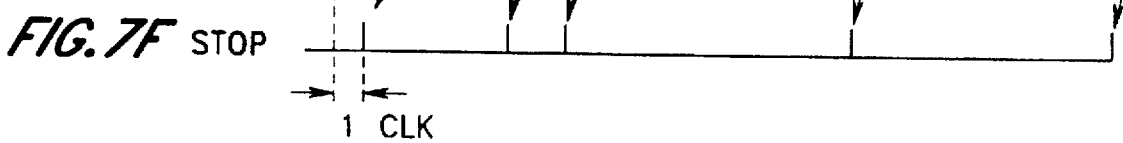

FIG.9A
FIG.9B VCO
$\begin{pmatrix} f_1 = 1/t \\ f_2 = \\ 1/(t+\Delta t) \end{pmatrix}$
FIG.9C VCO
FIG.9D
FIG.9E Tn=t
FIG.9F NOISE
FIG.9G VCO
FIG.9H
FIG.9I
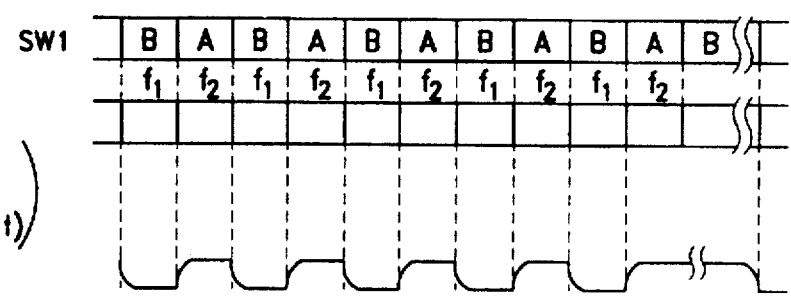
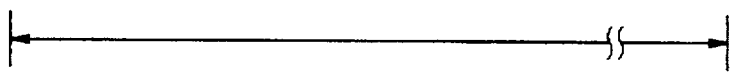
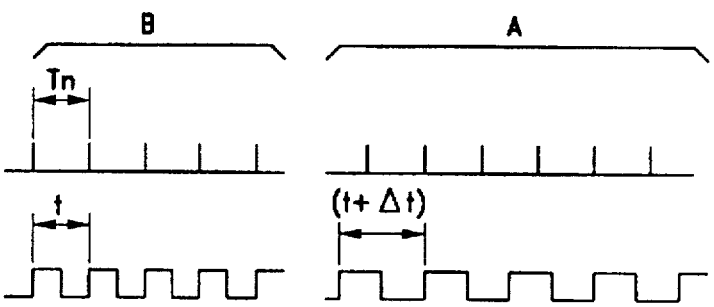
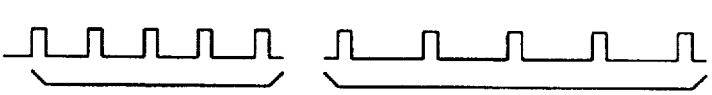

FIG. 11A SW2,SW3 | B | A | B | A | B | A | B | A | B | A | B | A |
FIG. 11B VCO ←— $f_1$ ——→
FIG. 11C VCO ($f_1 = 1/t$)
FIG. 11D
FIG. 11E $T_n = t$
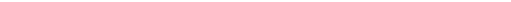
FIG. 11F
FIG. 11G VCO
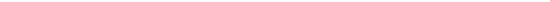
FIG. 11H
FIG. 11I

DELAY TIME MEASUREMENT APPARATUS FOR DELAY CIRCUIT

FIELD OF THE INVENTION

This invention relates to a delay time measurement apparatus for delay circuits used in a semiconductor test system, and more particularly, to a delay time measurement apparatus which is capable of accurately measuring the delay times of the delay circuits without being affected by periodic noises existing in the delay circuits of the semiconductor test system to be measured.

BACKGROUND OF THE INVENTION

In testing a semiconductor device by a semiconductor test system such as an IC tester, test signals are supplied to each pin of the semiconductor device with various predetermined timings and the resulted output of the semiconductor device under test is compared with expected data to determine whether the semiconductor device functions correctly or not. Since recent semiconductor devices have a large number of pins, such as 100 or more, a semiconductor test system has a large number of test channels each of which corresponds to a pin of a device to be tested.

To produce various timings in the test signals and/or adjust the timing differences among a plurality of test channels which correspond to device pins, a semiconductor test system includes delay circuits in each test channel. Delay times in the delay circuits must be accurately measured and set in the delay circuits to generate the test signals with high timing accuracy.

FIGS. 12–14 show a conventional delay time measurement technology for measuring delay times in a delay circuit. An example of circuit configuration for measuring the delay time is shown in FIG. 12 in which a closed loop is formed which includes a delay circuit to be measured. The circuit of FIG. 12 includes an OR gate 33 for applying a start pulse therethrough, a frequency counter 20 for counting an oscillation frequency of the closed loop, a wave formatter 30 for wave shaping a signal to have a constant pulse width, a variable delay circuit 21 for producing delay times and an AND gate 34 which forms a closed loop by connecting a feed back path 35 to the OR gate 33.

The variable delay circuit 21 in FIG. 12 is a component in each test channel of the semiconductor test system necessary to generate the test signals. The purpose of the circuit configuration of FIG. 12 is to measure the delay time in the variable delay circuit 21. The variable delay circuit 21 includes delay elements $23_1$–$23_n$ which are weighted by binary code 1–n for delaying a signal passing therethrough by a time defined by the binary code, and multiplexers $25_1$–$25_n$ for selecting outputs of the corresponding variable delay elements $23_1$–$23_n$. A delay time of each delay element is adjustable through a calibration process based on the measurement results.

Measurement of an overall delay time of the variable delay circuit 21 and calibration of the variable delay circuit based on the measurement results are proceeded as described in the following:

At the start of the measurement of the delay time in the variable delay circuit 21, a loop set signal at the AND gate 34 is turned to a high level. Then a start pulse is input to the OR gate 33. Since a closed loop is formed through the AND gate and the feed back path 35, an oscillation starts in the closed loop. A time period of the oscillation frequency in the closed loop is equal to an overall delay time of the closed loop. In this situation, if select signals set all of the multiplexers $25_1$–$25_n$ to select input terminals A, i.e., to allow a signal without passing through any of the delay elements, the oscillation frequency is determined by the closed loop without the delay elements $23_1$–$23_n$. The oscillation frequency is measured by the counter 20 which is used as a reference time.

By setting one of the multiplexers to select an input terminal B, corresponding one of the delay elements is inserted in the closed loop, which determines the oscillation frequency of the closed loop. Thus, by studying the difference between the oscillation frequencies, i.e., a time difference from the reference time, a delay time in each delay element can be measured. Therefore, based on this measured delay time, calibration of the delay time of each delay element or a delay time of an overall variable delay circuit is performed.

Generally, in such a measurement and calibration process, an unwanted periodic noise exists in a circuit such as the closed loop because pulse signals of constant periods are circulating in the loop. Further, in case where a system is operated based on clock signals produced from a reference signal by dividing the reference signal, noises originated from such clock signals exist in a circuit in question in the system. Such noises may come through the grounds of the circuit and the system, or through a crosstalk wherein undesired transfer occurs between circuit components or lines. As a result, in a circuit arrangement such as in FIG. 12, periodic noises may be induced in the delay circuits to be measured. Although noises may be reduced, it is not possible to completely suppress the noises.

If the noise is random, it may not be very harmful to a circuit in question, such as the delay circuit to be measured, because the random noise can be reduced by an averaging process. However, if the noise is periodic, it is usually difficult to provide a means for preventing the circuit from being affected by the periodic noise. Therefore, such a periodic noise causes a problem in the high resolution measurement and calibration of the delay time in the semiconductor test system.

In particular, in a situation where a delay time is measured and calibrated by monitoring the frequency and period of the loop oscillation signal as noted above, a periodic noise directly affects the measurement and calibration as shown in FIG. 13. When the delay time in the delay circuit to be measured is changed in a manner shown in FIG. 13, and when the period of the delay time shown in FIG. 13B approaches the period of the periodic noise shown in FIG. 13A, a loop oscillation is pulled-in by the periodic noise coming from the other circuit of the system. A similar problem also arises by the noise produced by the closed loop itself, such as in the delay circuit to be measured. Therefore, for certain points of the delay time, the accurate measurement of the delay time is unavailable in the conventional arrangement.

As shown in FIG. 14, which shows a relationship between the delay time designated in the delay circuit and the measured time period (frequency), nonlinear portions are caused by the periodic noise. Therefore, in the conventional technology, high precision measurement or calibration of the delay time is not available for such nonlinear points. If the noise is repeated in a random manner, such noise will be reduced by averaging the measured data obtained by enlarging a gate time for counting the oscillation frequency in the closed loop. However, since the noise is periodic, i.e., repeated in a fixed period of time, the noise problem is not avoidable by such averaging procedure.

SUMMARY OF THE INVENTION

It is, therefore, an object of the present invention to provide a delay time measurement apparatus for delay circuits used in a semiconductor test system which is capable of accurately measuring the delay times of the delay circuits without being affected by periodic noises exist in the delay circuits of the semiconductor test system.

It is another object of the present invention to provide a delay time measurement apparatus which is capable of varying the phase of an oscillation signal propagating in the delay circuit under test so as to avoid a phase match between the signal and the periodic noises.

It is a further object of the present invention to provide a delay time measurement apparatus which is capable of extracting a plurality of pairs of pulses from the output of a voltage controlled oscillator in an arbitrary interval so that the signal repetition rate is decreased relative to the repetition rate of the periodic noises to differentiate the phases between the signal and the periodic noises.

It is a further object of the present invention to provide a delay time measurement apparatus which is capable of periodically adding the known delay time to an oscillation signal propagating in the delay circuit under test to differentiate the phases between the signal and the periodic noises.

According to the first aspect of the present invention, the delay time measurement apparatus measures the oscillation frequency of a voltage controlled oscillator in a phase lock loop, one cycle time of the oscillation frequency is controlled to be equal to the delay time in the delay circuit under test. The oscillation frequency is fluctuated by an external signal introduced in the phase lock loop whereby the influence by the periodic noise is minimized by avoiding a similarity of phases between the oscillation frequency and the periodic noise.

The delay time measurement apparatus of the present invention includes: a voltage controlled oscillator whose oscillation frequency is controlled by a voltage supplied thereto; a phase comparator having two inputs for comparing a phase difference between signals at the two inputs where one of the inputs receives an output of the voltage controlled oscillator through a delay circuit whose delay time is to be measured and the other input directly receives the output of the voltage controlled oscillator; a phase lock loop having the voltage controlled oscillator and the phase comparator therein, wherein the phase lock loop returns an output voltage of the phase comparator to the voltage controlled oscillator to control an oscillation frequency of the voltage controlled oscillator such that the phase difference between the two inputs of the phase comparator becomes zero; a signal adder for introducing an external signal into the phase lock loop for fluctuating the oscillation frequency wherein the external signal is a signal whose average voltage level for an integer multiple of one cycle is zero; and a counter for counting the oscillation frequency of the voltage controlled oscillator.

According to the present invention, the oscillation frequency of the voltage controlled oscillator is fluctuated by the external signal whose average voltage is zero in a predetermined time length. As a consequence, the phase of the signal passing through the closed loop varies with respect to the phase of the periodic noise. Thus, the oscillation in the loop is not disturbed by the periodic noise, which makes possible the delay time measurement of the delay circuit with high accuracy.

A second aspect of the present invention is a delay time measurement apparatus having higher measurement accuracy by arbitrarily selecting a pair of pulses from the output of the voltage controlled oscillator. In addition to the structural elements of the first aspect of the invention as noted above, the second aspect of the delay time measurement apparatus includes an extracting circuit connected to the voltage controlled oscillator for extracting a pair of pulses from the output of the voltage controlled oscillator in a desired interval.

The pair of the pulses are two consecutive pulses in the output of said voltage controlled oscillator one of which passes through the delay circuit and reaches the phase comparator and the other directly reaches the phase comparator. The interval of extracting the pairs of pulses may be a fixed interval or random intervals. The random intervals may be generated by having a pseudo random signal generator, such as an M-sequence generator.

According to the second aspect of the present invention, the signal repetition rate in the phase lock loop against the periodic noise is varied by extracting the pairs of pulses in the arbitrary intervals. Thus, in addition to the effects of the frequency fluctuation by the external signal in the first aspect of the invention, the noise influence is further reduced because of the extracting interval.

A third aspect of the present invention is a delay time measurement apparatus having higher measurement accuracy by periodically adding a known delay time to the delay time of the delay circuit under test. In addition to the structural elements of the first aspect of the invention as noted above, the third aspect of the delay time measurement apparatus includes a delay line connected between the voltage controlled oscillator and the phase comparator and having a known delay time, and a switch for alternately changing signal paths for periodically adding the known delay time of the delay line to the delay time of the delay circuit to be measured.

According to the third aspect of the present invention, the signal phase in the phase lock loop relative to the periodic noise is varied by periodically adding the known delay time to the signal path having the delay circuit to be measured. Thus, in addition to the effects of the frequency fluctuation by the external signal as in the first aspect of the invention, the noise influence is further reduced by differentiating the phases between the signal to be measured and the periodic noise.

A fourth aspect of the present invention is a delay time measurement apparatus having higher measurement accuracy by periodically adding the known delay time to a signal path having the delay circuit under test and also to another signal path without having the delay circuit. In addition to the structural elements of the first aspect of the invention as noted above, the fourth aspect of the delay time measurement apparatus includes a pair of delay lines connected between the voltage controlled oscillator and the phase comparator and having a known identical delay time with one another, and a pair of switches for alternately changing signal paths connected to the phase comparator for periodically adding the known delay time of the delay line to the output of the voltage controlled oscillator to be received by both of the two inputs of the phase comparator.

According to the fourth aspect of the present invention, similar to the third aspect of the invention, the signal phase in the phase lock loop relative to the periodic noise is varied by periodically adding the known delay time to the signal path having the delay circuit under test and also to the other signal path without having the delay circuit. Thus, in addition to the effects of the frequency fluctuation by the external signal of the first aspect of the invention, the noise influence is further reduced by differentiating the phases between the signal to be measured and the periodic noises.

As in the foregoing, according to the present invention, the delay time measurement apparatus for a semiconductor test system is able to measure the delay times in the delay circuits with high accuracy and resolution by minimizing the influence of the periodic noises.

BRIEF DESCRIPTION OF THE DRAWINGS

FIG. 4 is a timing chart showing an example of operation of an extracting circuit for extracting a pair of pulses in an arbitrary interval in the second embodiment of the present invention.

FIG. 5 is a timing chart showing another example of operation of an extracting circuit for extracting a pair of pulses in an arbitrary interval in the second embodiment of the present invention.

FIG. 6 is a block diagram showing a circuit configuration of an extracting circuit for extracting a pair of pulses in an arbitrary interval in the second embodiment of the present invention.

FIG. 7 is a timing chart showing an operation of the extracting circuit of the block diagram of FIG. 6.

FIG. 9 is a timing chart showing an operation of the delay time measurement apparatus of the third embodiment of FIG. 8.

FIG. 11 is a timing chart showing an operation of the delay time measurement apparatus of the fourth embodiment of FIG. 10.

DETAILED DESCRIPTION OF THE PREFERRED EMBODIMENT

A first embodiment of the present invention is described with reference to the drawings. The first embodiment of the delay time measurement apparatus for delay circuits in accordance with the present invention is shown in FIGS. 1 and 2.

In the present invention, a voltage controlled oscillator (VCO) is used in a phase lock loop which forms a negative feedback loop. The phase lock loop controls the VCO to oscillate in a time period equal to a delay time in a delay circuit to be measured.

Figure 1:
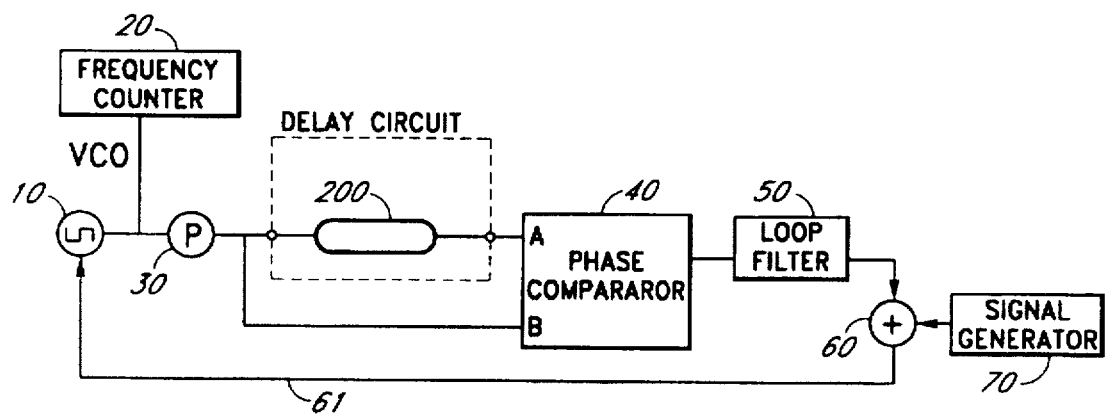
FIG. 1 is a block diagram showing a first embodiment of the delay time measurement apparatus of the present invention to be used in a semiconductor test system.

As shown in FIG. 1, the delay time measurement apparatus is formed of a voltage controlled oscillator (VCO) 10 whose frequency is controlled by a voltage supplied thereto, a frequency counter 20 for counting the frequency of the VCO 10, a wave formatter 30 to format the output of the VCO 10 to a pulse signal of a fixed pulse width, a phase comparator 40 to detect a phase difference between two incoming signals and to generate a voltage proportional to the phase difference, a loop filter 50 to condition a loop response of a phase lock loop, a signal adder 60 to introduce an external signal into the phase lock loop and a frequency spread signal generator 70 to provide a specific signal to the phase lock loop PLL through the signal adder 60.

The output of the phase comparator 40 feedbacks to the VCO 10 through the loop filter 50 and the signal adder 60 to control the oscillation frequency of the VCO 10 to form a feedback loop, i.e., a phase lock loop. An example of the VCO is an LC oscillator having a variable capacitance diode as a resonance capacitor. The loop filter 50 is basically a first order low pass filter to determine a time constant of the phase lock loop. The loop filter 50 usually includes an amplifier to increase the gain of the phase lock loop. An example of the signal adder 60 is a summing amplifier formed of an operational amplifier having two input terminals for summing two input signals supplied thereto.

The output of the VCO 10 is wave-shaped by the wave formatter 30 and is directly provided to an input B of the phase comparator 40. The output of the wave formatter 30 is also provided to an input A of the phase comparator 40 through a delay circuit 200 to be measured. The phase difference between the signals at the inputs A and B of the phase comparator 40 is detected and a difference voltage representing the phase difference returns to the VCO 10 through the loop filter 50 and the signal adder 60. The phase lock loop controls the oscillation frequency of the VCO 10 such that the phase difference between the input terminals A and B becomes zero.

When the phase lock loop is reached a lock-in state, and thus, the frequency of the VCO is also reached a steady state, the phase of the pulse through the delay circuit 200 and the phase of the pulse which is one cycle after the one that has passed through the delay circuit 200 coincide with one another at the phase comparator 40. This means that, at the lock-in state of the phase lock loop, the time period of the oscillation frequency of the VCO 10 is equal to the delay time of the delay circuit 200 under test.

Through the signal adder 60, a signal from the frequency spread signal generator 70 is introduced in the phase lock loop. In this situation, the frequency spread signal provided in the phase lock loop modulates the oscillation frequency of the VCO 10. Thus, as shown in the timing chart of FIGS. 2B and 2C, the pulse signal at the input terminal A of the phase comparator 40 coming through the delay circuit 200 under test and the pulse signal at the input terminal B of the phase comparator 40 are fluctuated in the phase in response to the frequency spread signal.

Figure 2A:
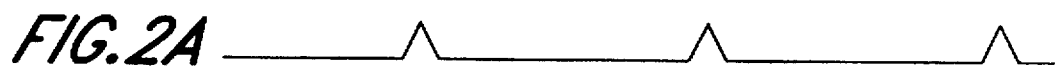
FIG. 2 is a timing chart showing an operation of the delay time measurement apparatus of the first embodiment of FIG. 1.
Figure 2B:
Figure 2C:
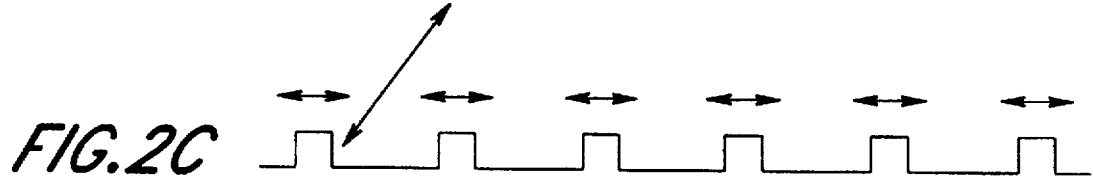

The time constant of the phase lock loop is set to be sufficiently larger than the time period of the frequency spread signal. In other words, the frequency of the frequency spread signal is sufficiently higher than the band width of the phase lock loop which is determined by the loop filter 50. In this arrangement, the influence by the periodic noise such as shown in FIG. 2A against the delay circuit 200 is reduced because the phases of the oscillation frequency will not match with or approach too close to the phase of the periodic noise.

The signal generated by the spread frequency signal generator 70 has a character that an average voltage in a predetermined time length is zero such as a sine wave, a Gaussian noise or a triangular wave. The time period of the output of the VCO is obtained by the average frequency measured by the frequency counter 20. Since the average output voltage of the frequency spread signal generator 70 is zero, any measurement errors produced by the frequency spread signal are canceled when loop oscillation frequency is measured by the frequency counter 20. To effectively average the output voltage of the frequency spread signal generator 70, a gate time (a time period for counting the frequency) of the frequency counter 20 is set to an integer multiple of one cycle period of the frequency spread signal.

By the arrangement of the present invention, the errors associated with an external periodic noise or a self-induced periodic noise are reduced because the phases of such noise will not agree with the phase of the oscillation frequency. Thus, the delay time of the delay circuit 200 can be measured with high accuracy. Further, in case where the delay time in the delay circuit is variable, the delay time can be measured with high accuracy for all the delay times without being affected by the periodic noise.

In the foregoing, the phase lock loop controls so that the signals at the input terminals A and B of the phase comparator are one cycle shifted at the output of the VCO 10, i.e., the time period of the VCO is locked to be equal to the delay time in the delay circuit 200. However, it is also possible to lock the VCO 10 such that two or more time periods of the oscillation frequency are equal to the delay time of the delay circuit.

The second embodiment of the present invention is described with reference to the drawings. The second embodiment of the delay time measurement apparatus for delay circuits is shown in FIGS. 3–7.

In this invention, as in the first embodiment, a voltage controlled oscillator (VCO) is used in a phase lock loop which forms a negative feedback loop. The phase lock loop controls the VCO to oscillate in a time period equal to a delay time in a delay circuit to be measured. A pair of pulses to be phase locked with one another is extracted from the output of the VCO in an arbitrary time interval.

Figure 3:
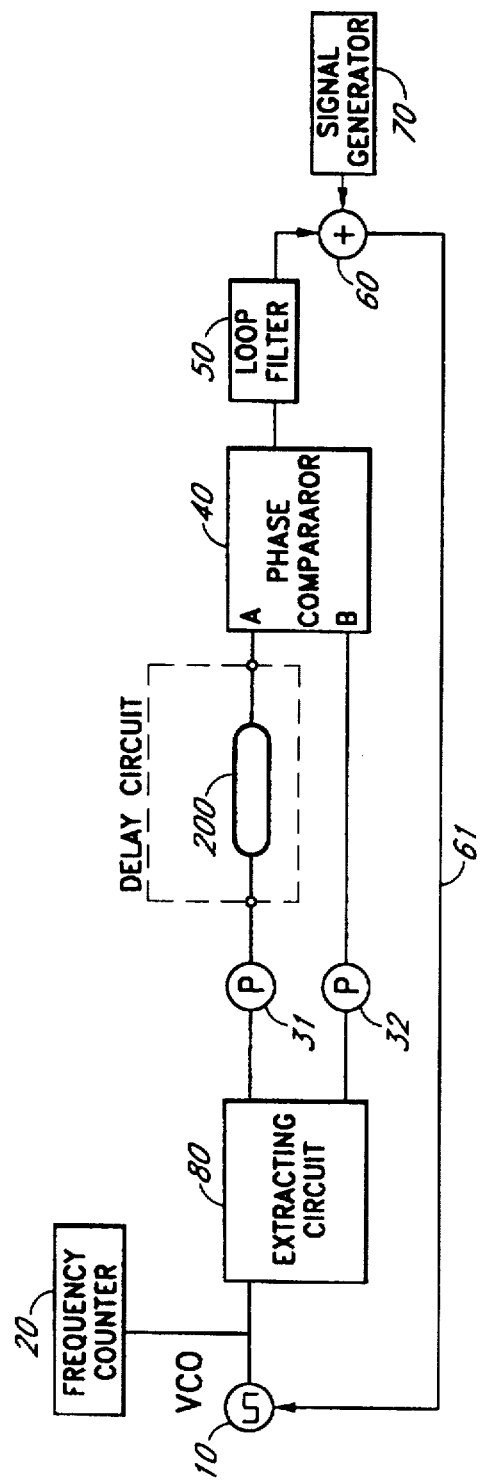
FIG. 3 is a block diagram showing a second embodiment of the delay time measurement apparatus of the present invention.

As shown in FIG. 3, the delay time measurement apparatus of the second embodiment is formed of a voltage controlled oscillator (VCO) 10 whose frequency is controlled by a voltage supplied thereto, a frequency counter 20 for counting the frequency of the VCO 10, an extracting circuit 80 for extracting a pair of pulses from a series of pulse signal as start and stop pulses, a pair of wave formatters 31 and 32 to format the start and stop pulses, respectively, from the extracting circuit 80 to form pulse signals of a fixed pulse width, a phase comparator 40 to detect a phase difference between two incoming signals and to generate a voltage proportional to the phase difference, a loop filter 50 to condition a loop response of a phase lock loop, a signal adder 60 to introduce an external signal into the phase lock loop and a frequency spread signal generator 70 to provide a specific signal to the phase lock loop PLL through the signal adder 60.

Other than the extracting circuit 80 and the wave formatters 31 and 32, the circuit configuration of FIG. 3 is the same as the delay time measurement apparatus of FIG. 1. In the example of FIG. 3, the extracting circuit 80 extracts a pair of pulses, i.e., two consecutive pulses from the output of the VCO 10. The first pulse (start pulse) is provided to the delay circuit 200 to be measured through the wave formatter 31 and then to the input A of the phase comparator 40. The second pulse (stop pulse) is provided to the input B of the phase comparator 40 through the wave formatter 32.

FIG. 4 is a timing chart showing an example of operation of an extracting circuit for extracting a pair of pulses in an arbitrary interval in the second embodiment of the present invention. FIG. 4A shows a situation where the start and stop pulses are consecutively taken from the output of the VCO without any jumps. Thus, this operation is basically the same as that of FIG. 1 which has no extracting circuit. In this situation, if a delay time Td of a periodic noise such as shown in FIG. 4A2 is similar to the period of the oscillation frequency delay time in the delay circuit 200, the delay time measurement is adversely affected by the periodic noise since the phase of the noise approaches the phase of the oscillation frequency.

Such a delayed noise may be caused by a crosstalk between the circuit components wherein the noise is produced which is slightly delayed from the original signal. For example, the delayed noise may be produced by the oscillation signal propagating in the delay circuit under test.

Thus, as shown in the timing chart of FIG. 4B, the extracting circuit takes pairs of pulses from the output of the VCO 10 while skipping pulses between the selected pairs of pulses. For example, the output of the VCO has pulses $P_1$–$P_7$ as shown in FIG. 4B1. In this example, the extracting circuit 80 extracts a pair of pulses $P_1$ and $P_2$, and a pair of pulses $P_4$ and $P_5$. In the first pair, the pulse $P_1$ is used for a start pulse and the pulse $P_2$ is used for a stop pulse.

The pulse $P_1$ is provided to the delay circuit 200 under test as in FIG. 4B2 and then to the input A of the phase comparator 40 as in FIG. 4B4. The pulse $P_2$ is directly provided to the input B of the phase comparator 40 as in FIG. 4B5. In the same way, the pulse $P_4$ is provided to the delay circuit 200 under test as in FIG. 4B2 and then to the input A of the phase comparator 40 as in FIG. 4B4. The pulse $P_5$ is directly provided to the input B of the phase comparator 40 as in FIG. 4B5. The pulses $P_3$ and $P_6$ are skipped by the extracting circuit 80 of the present invention.

As shown in FIG. 4B3, a delayed noise originated by the pulses $P_1$ and $P_4$ are induced in the delay circuit 200 through the crosstalk, for example, as noted above. In this situation, however, the period of the noise of FIG. 4B3 is substantially different from (larger than) the period T of the oscillation frequency of FIG. 4B1. Therefore, such a delayed noise will not adversely affect the accuracy of the measurement in the delay time measurement apparatus of the present invention.

Such a skipping operation of the pulses by the extracting circuit 80 to extract the pairs of pulses need not be in a fixed interval manner but may be a random sequence. FIG. 5 shows such an example of selecting the pair of pulses in a random manner. The random interval selection has a better noise reduction effect than the fixed interval selection such as shown in FIG. 4B. In FIG. 5B, a first pair of pulses $P_2$ and $P_3$, a second pair of pulses $P_5$ and $P_6$, and a third pair of pulses $P_{12}$ and $P_{13}$ are extracted to be used as start and stop pulses of FIGS. 5C and 5D.

Between the first pair of pulses $P_2$ and $P_3$ and the second pair of pulses $P_5$ and $P_6$, a pulse $P_3$ is skipped while between the second pair of pulses $P_5$ and $P_6$ the third pair of pulses $P_{12}$ and $P_{13}$, pulses $P_7$–$P_{11}$ are skipped by the extracting circuit 80. In this manner, the skipping interval is randomly set in the example of FIG. 5.

FIG. 6 is a block diagram showing a circuit configuration of the extracting circuit 80 for extracting the pairs of pulses in the random interval as shown in FIG. 5. FIG. 7 is a timing chart showing an operation of the extracting circuit of FIG. 6. The extracting circuit 80 of FIG. 6 includes an M-sequence generation circuit 81 which generates a random sequence signal, and D-type flip-flops 82–84. An example of the M-sequence generation circuit is a pseudo random binary sequence circuit formed of a series of shift registers and an exclusive OR circuit in a feedback loop as is well known in the art. The D-type flip-flops 82–84 produce output data which is delayed by one clock from the input data.

The M-sequence generation circuit 81 generates a random sequence signal in synchronism with a clock signal which is in this case an output of the VCO 10. The output of the VCO 10 is also provided to the clock inputs of the flip-flops 82–84. The flip-flop 82 and 83 produce the same output data since the input data, i.e., the random data, and the clock, i.e., the VCO output, are common therebetween. The flip-flop 84 is series connected to the flip-flop 83. Thus, the output of the flip-flop 84 is one cycle delayed from the output of the flip-flops 82 and 83. The output of the flip-flop 82 is a start pulse to be supplied to the delay circuit 200 to be measured and the output of the flip-flop 84 is a stop pulse to be supplied to the phase comparator 40 directly.

In FIGS. 6 and 7, the clock signal CLK of FIG. 7A which is the output of the VCO 10 in this invention is provided to the M-sequence generation circuit 81. As noted above, the VCO output is also provided to the clock inputs of the D-type flip-flops 82–84. The output 101 of the M-sequence generation circuit 81 is shown in FIG. 7B wherein rise timings are random according to the stages of shift registers (not shown) in the circuit 81. An output 102 of the flip-flop 82 and an output 103 of the flip-flop 83 are identical as shown in FIG. 7C which are produced in synchronism with the VCO output.

The start pulse of FIG. 7E is produced by the rising edge of the output 102 of the flip-flop 82. The stop pulse of FIG. 7F is produced by the rising edge of an output 103 of the flip-flop 84 shown in FIG. 7D which is one cycle of the VCO output delayed from the output 103 of the flip-flop 83. As shown in FIGS. 7E and 7F, time intervals between the start pulses or the stop pulses are random because of the random signal 101 generated by the M-sequence generation circuit 81. If a counter is used instead of the M-sequence generation circuit 81, pairs of start and stop pulses can be generated in a fixed interval.

In either examples of the fixed interval as in FIG. 4B or the random interval as in FIG. 5, the frequency of the VCO 10 is controlled by the phase clock loop so that the time difference between the start and stop pulses, i.e., the selected two pulses, is equal to the delay time in the delay circuit 200 under test.

Namely, when the phase lock loop is reached a lock-in state, and thus the frequency of the VCO is also reached a steady state, the phase of the start pulse through the delay circuit 200 and the stop pulse directly provided to the phase comparator 40 are controlled to be fixed. Thus, at the lock-in state of the phase lock loop, the time period of the oscillation frequency of the VCO 10 is equal to the delay time of the delay circuit 200 under test.

In the second embodiment in the foregoing, the time period of the delayed noise such as shown in FIG. 4B3 in the delay circuit 200 becomes substantially larger than the time period of the VCO output. Therefore, the delayed noise will not adversely affect the accuracy of the measurement in the delay time measurement apparatus of the present invention because the phases of the periodic noise will not coincide with the phases of the oscillation frequency.

The third embodiment of the present invention is described with reference to the drawings. The third embodiment of the delay time measurement apparatus for delay circuits is shown in FIGS. 8 and 9.

In this present invention, as in the first and second embodiments, a voltage controlled oscillator (VCO) is used in a phase lock loop which forms a negative feedback loop. The phase lock loop controls the VCO to oscillate in a time period equal to a delay time in a delay circuit to be measured or a delay time which is the sum of the delay time of the delay circuit and a known delay time of a delay line. Before being supplied to the delay circuit 200 under test, the VCO output is periodically added with a known delay time Δt by a switch circuit. This arrangement further promote reducing the adverse effects of the periodic noise in the delay time measurement.

Figure 8:
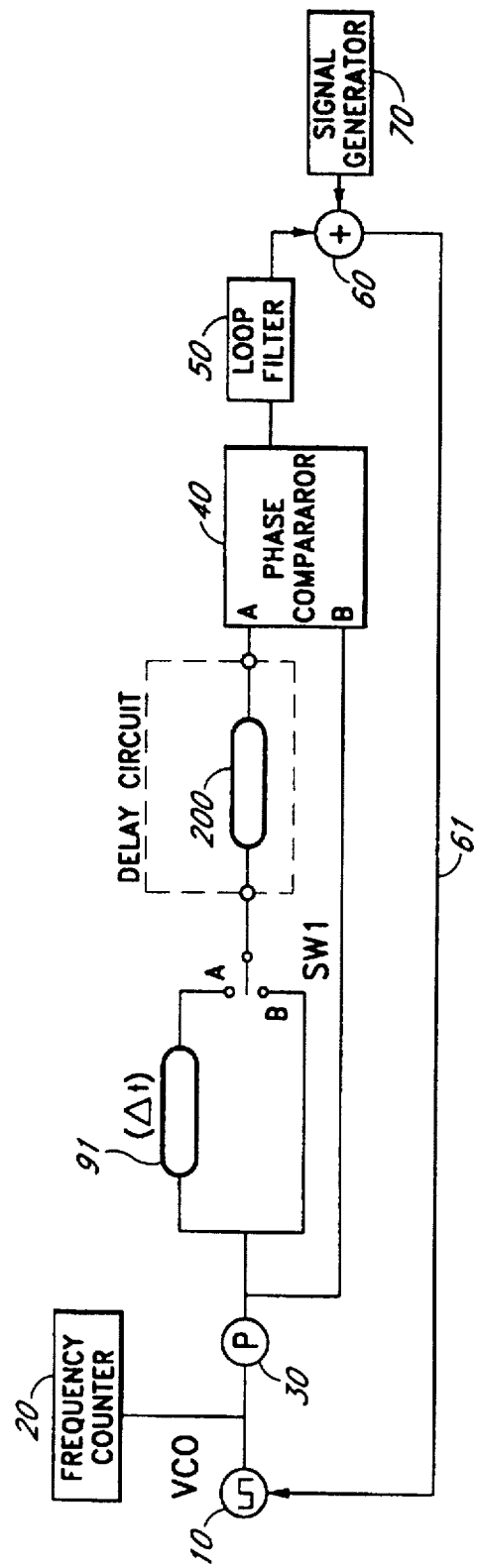
FIG. 8 is a block diagram showing a third embodiment of the delay time measurement apparatus of the present invention.

As shown in FIG. 8, the delay time measurement apparatus of the third embodiment is formed of a voltage controller (VCO) 10 whose frequency is controlled by a voltage supplied thereto, a frequency counter 20 for counting the frequency of the VCO 10, a wave formatter 30 to wave shape the output of the VCO to a pulse signal having a fixed pulse width, a delay line 91 with a known delay time Δt, and a switch SW1 between the delay line 91 and a delay circuit 200 to be measured, a phase comparator 40 to detect a phase difference between two incoming signals and to generate a voltage proportional to the phase difference, a loop filter 50 to condition a loop response of a phase lock loop, a signal adder 60 to introduce an external signal into the phase lock loop and a frequency spread signal generator 70 to provide a specific signal to the phase lock loop through the signal adder 60.

Other than the delay line 91 and the switch SW1, the circuit configuration of FIG. 8 is basically the same as the delay time measurement apparatus of FIGS. 1 and 3. In the example of FIG. 8, the switch SW1 changes signal paths to transfer the output of the VCO 10 to the delay circuit 200. One signal path has the delay line 91 and the other signal path has no delay line.

When the switch SW1 is in a side A (period A), the VCO output from the wave formatter 30 is transmitted to the delay circuit 200 through the delay line 91. When the switch SW1 is in a side B (period B), the VCO output from the wave formatter 30 is directly transmitted to the delay circuit 200. The output of the delay circuit 200 is connected to the input A of the phase comparator 40. The input B of the phase comparator is directly connected to the wave formatter 30 as in the same way in FIGS. 1 and 3.

The switch SW1 alternately changes the connection to the side A (period A) or to the side B (period B). Each of the periods A and B is selected sufficiently longer than the time constant of the phase lock loop, i.e., a lock-in time of the phase lock loop. Therefore, during each period of either the periods A or B, the phase lock loop is sufficiently in a steady state of the lock-in.

In the period B, the VCO 10 is phase locked so that the oscillation frequency is $f_1=1/t$, and in the period A, the VCO 10 is phase locked so that the oscillation frequency is $f_2=1/(t+\Delta t)$. When the gate time for the frequency counter 20 is sufficiently long, the frequency $f=1/T$ counted by the frequency counter is an average of the two frequencies $f_1$ and $f_2$. Thus, for example, if the switch SW1 is switching in a duty ratio 50%, the time period of the measured frequency is $T=(2t+\Delta t)/2$. Since the delay time Δt in the delay line 91 is known, the delay time t of the delay circuit 200 is obtained by the period T of the output of the VCO 10.

FIG. 9 is a timing chart showing an operation of the delay time measurement apparatus of FIG. 8. The switch SW1 changes to the signal path having the delay line 91 in the period A and to the signal path having no delay line in the period B as in FIG. 9A. Since each of the periods A and B is selected sufficiently longer than the time constant of the phase lock loop, the VCO frequency is locked to $f_1$ in the period B and $f_2$ in the period A as in FIG. 9B. A control voltage 61 for the VCO is shown in FIG. 9C. Since the gate time for counting the frequency therein is sufficiently longer as in FIG. 9D, the frequency f counted by the frequency counter 20 is an average of the frequencies $f_1$ and $f_2$ as noted above.

FIGS. 9E–9I show an enlarged view of the timing in the periods B and A, respectively. During the period B, the VCO output through the wave formatter 30 is provided to the delay circuit 200 under test and then to the input A of the phase comparator 40 as in FIG. 9I. The VCO output through the wave formatter 30 is also directly provided to the input B of the phase comparator 40 as in FIG. 9H. It should be noted that the above situation is the same as that of FIG. 1. Therefore, the phase lock loop controls the VCO output of FIG. 9G so that the time period is equal to the delay time t in the delay circuit 200.

During the period A, the VCO output through the wave formatter 30 is provided to the delay circuit 200 under test after passing through the delay line 91. Then the output of the delay line 91 is provided to the input A of the phase comparator 40 as in FIG. 9I. The VCO output through the wave formatter 30 is also provided to the input B of the phase comparator 40 directly as in FIG. 9H. Thus, in this situation, the delay time At of the delay line 91 is added to the delay time of the delay circuit 200. Therefore, the phase lock loop controls the VCO output of FIG. 9G so that the time period is equal to the sum of the delay times (t+Δt) in the delay line 91 and the delay circuit 200. FIG. 9F shows a periodic noise whose timings are similar to the VCO output in the period B while substantially different in the period A.

In the third embodiment of FIGS. 8 and 9, since the delay time for the signal passing through the delay circuit 200 is periodically changed by inserting the delay line 91. Therefore, the adverse effects of the periodic noise are reduced in the measurement of the delay time because the known delay time is added to the delay time to be measured in the period A so that the timings of the noise and the oscillation frequency will not match with one another.

In the foregoing, although it is explained that the duty ratio is 50%, the switch SW1 may operate in other duty ratios with corresponding adjustments. The switch SW1 can be a solid switch such as a semiconductor switch or a mechanical switch or other types of switches.

Figure 10:
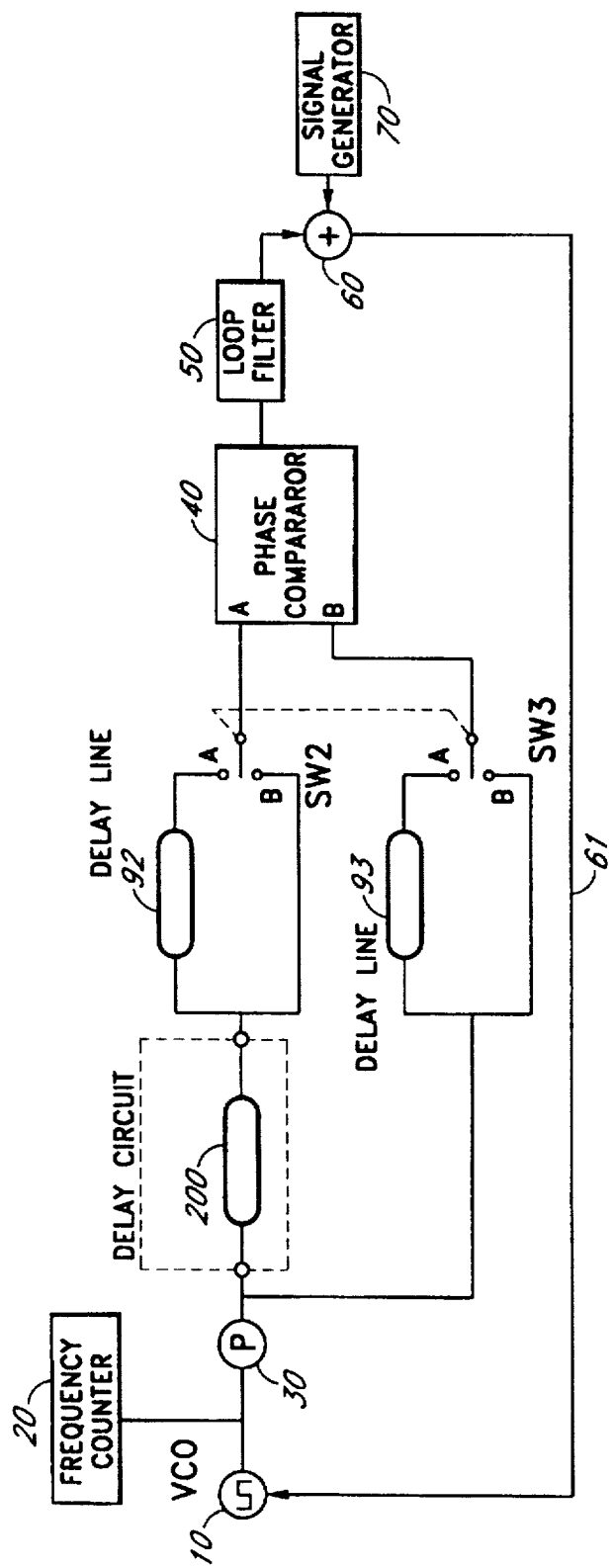
FIG. 10 is a block diagram showing a fourth embodiment of the delay time measurement apparatus of the present invention.
Figure 12:
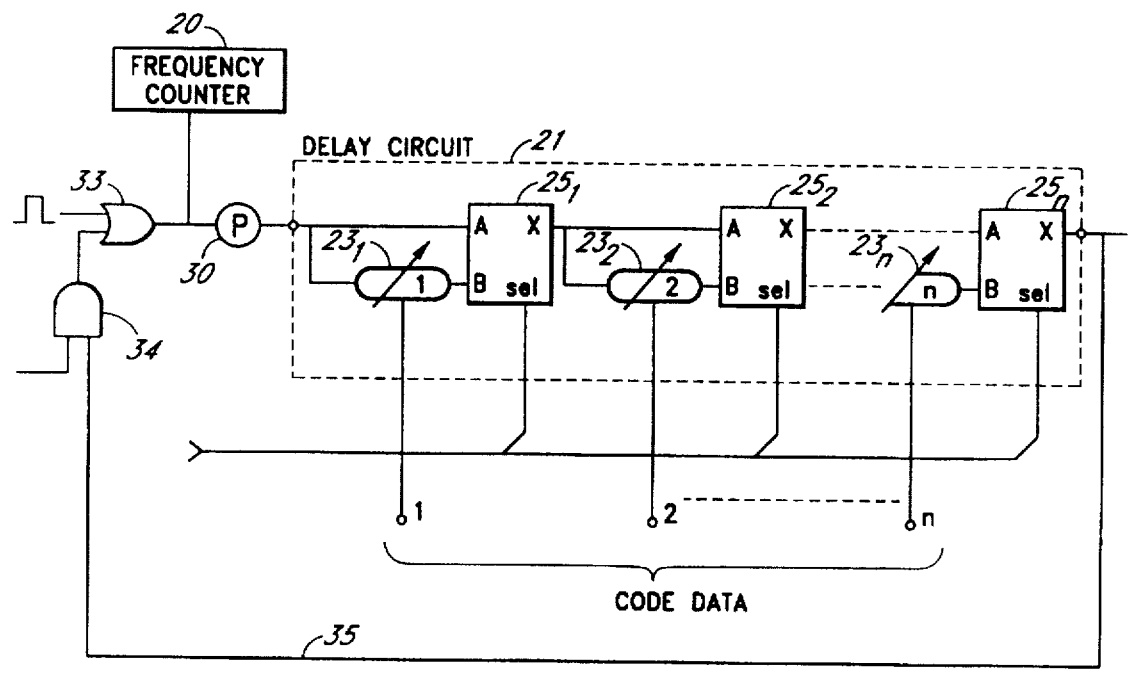
FIG. 12 is a block diagram showing a conventional delay time measurement apparatus used in a semiconductor test system.
Figure 13A:
FIG. 13 is a timing chart for showing an adverse effect to a loop oscillation by a periodic noise in the conventional delay time measurement apparatus.
Figure 13B:
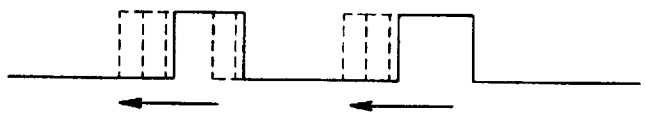
Figure 14:
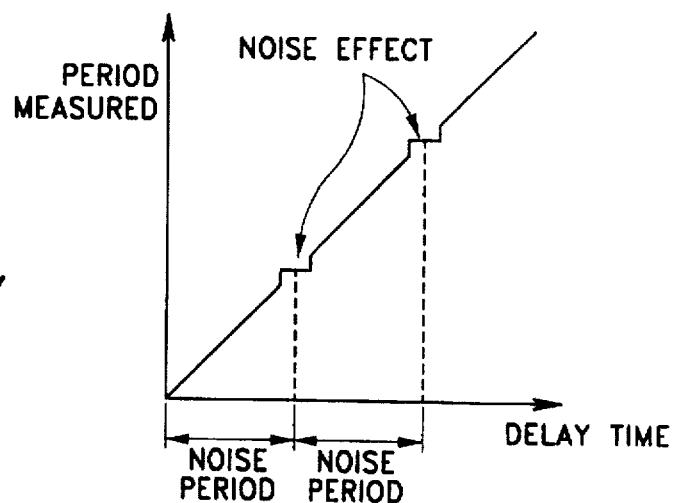
FIG. 14 is a graph showing a relationship between the delay time set in a delay circuit and the measured time period in the conventional delay time measurement apparatus.

The fourth embodiment of the present invention is described with reference to the drawings. The fourth embodiment of the delay time measurement apparatus for delay circuits is shown in FIGS. 10 and 11.

In this present invention, as in the first, second and third embodiments, a voltage controlled oscillator (VCO) is used in a phase lock loop which forms a negative feedback loop. The phase lock loop controls the VCO to oscillate in a time period equal to a delay time in a delay circuit to be measured. The VCO output is periodically added with a known delay time Δt by a pair of switch circuits. This arrangement further promote reducing the adverse effects of the periodic noise in the delay time measurement.

As shown in FIG. 8, the delay time measurement apparatus of the second embodiment is formed of a voltage controlled oscillator (VCO) 10 whose frequency is controlled by a voltage supplied thereto, a frequency counter 20 for counting the frequency of the VCO 10, a wave formatter 30 to wave shape the output of the VCO to a pulse signal having a fixed pulse width, delay lines 92 and 93 with a known delay time Δt, a pair of switches SW2 and SW3, a phase comparator 40 to detect a phase difference between two incoming signals and to generate a voltage proportional to the phase difference, a loop filter 50 to condition a loop response of a phase lock loop, a signal adder 60 to introduce an external signal into the phase lock loop and a frequency spread signal generator 70 to provide a specific signal to the phase lock loop through the signal adder 60.

In this embodiment, the delay line 93 and the switch SW3 are added to the embodiment of FIG. 8. In the example of FIG. 10, the delay line 93 is periodically inserted in the signal path to the input B of the phase comparator 40 by the switch SW3. The delay lines 92 and 93 have the same delay time Δt which is known in advance. The switches SW2 and SW3 operate in parallel at the same time.

When the switches SW2 and SW3 are in sides A (period A), the VCO output from the wave formatter 30 is transmitted to the delay circuit 200 through the delay line 92 and to the input A of the phase comparator. Also in the period A, the VCO output to the input B of the phase comparator passes through the delay line 93. When the switches SW2 and SW3 are in sides B (period B), the VCO output through the delay circuit 200 is directly transmitted to the input A of the phase comparator 40. Also in the period B, the input B of the phase comparator is connected through the switch SW3 to the wave formatter 30.

The switches SW2 and SW3 alternately change the connections to the sides A (period A) or to the side B (period B). Each of the periods A and B is selected sufficiently longer than the time constant of the phase lock loop, i.e., a lock-in time of the phase lock loop. Therefore, during each period of either A or B, the phase lock loop is sufficiently in the steady state wherein the lock-in has been reached.

In the period B, the VCO 10 is phase locked so that the oscillation frequency is f=1/t, where t is the delay time of the delay circuit 200, and in the period A, the VCO 10 is phase locked so that the oscillation frequency is also f=1/t. This is because the time difference between the two paths in the period A is the delay time t since the delay time Δt in the delay lines 92 and 93 are the same. Thus, the delay time of the delay circuit 200 is directly obtained from the frequency of the VCO output.

In the period A, the delay time Δt of the delay lines 92 and 93 are added to the signals before reaching the phase comparator 40. Therefore, in case where the periodic noise has a timing which is close to the VCO output, such a timing difference is increased by the delay time Δt in the period A. Therefore, the adverse influence of the periodic noise is reduced by differentiating the timings between the periodic noise and the VCO output.

FIG. 11 is a timing chart showing an operation of the delay time measurement apparatus of FIG. 11. The switches SW2 and SW3 change to the signal paths having the delay lines 92 and 93 in the period A and to the signal paths having no delay lines in the period B as in FIG. 11A. Since each of the periods A and B is selected to be sufficiently longer than the time constant of the phase lock loop, the VCO frequency is locked to the frequency f both in the periods A and B as in FIG. 11B. A control voltage 61 for the VCO is shown in FIG. 11C which is constant because the frequency is the same in either periods A and B. The gate time of FIG. 11D for counting the frequency therein is sufficiently longer than the time constant of the phase lock loop and the repetition rate of the periods A and B.

FIGS. 11E–11I show an enlarged view of the timing in the periods B and A, respectively. During the period B, the VCO output through the wave formatter 30 is provided to the delay circuit 200 under test and then to the input A of the phase comparator 40 as in FIG. 11I. The VCO output through the wave formatter 30 is also directly provided to the input B of the phase comparator 40 as in FIG. 11H. Therefore, the phase lock loop controls the VCO output of FIG. 11G so that the time period is equal to the delay time t in the delay circuit 200.

During the period A, the VCO output through the wave formatter 30 passes both through the delay circuit 200 under test and the delay line 92 to reach the input A of the phase comparator 40 as in FIG. 11I. The VCO output through the wave formatter 30 is also directly provided to the input B of the phase comparator through the delay line 93 as in FIG. 11H. Thus, in this situation, the delay time Δt of the delay lines 92 and 93 is added to both paths, one having the delay circuit 200 and the other without having the delay circuit 200. Therefore, the phase lock loop controls the VCO output of FIG. 11G so that the time period is equal to the delay time of the delay circuit 200 since the time difference between the two signal paths is equal to the delay time of the delay circuit. FIG. 11F shows a periodic noise whose time period is similar to the VCO output in the period B while substantially different in the period A.

In the fourth embodiment of FIGS. 10 and 11, since the delay time of the delay lines 92 and 93 is added to both of the paths connected to the phase comparator 40 in the period A, the phase of the signal passing through the paths is periodically changed. Thus, when the phase of the noise is close to the phase of the VCO output, the adverse effects of the periodic noise are reduced in the measurement of the delay time because the phase difference is increased by the insertion of the delay lines.

According to the present invention, the delay time measurement apparatus for a semiconductor test system is able to measure the delay time of the delay circuit with high accuracy. The delay time measurement apparatus of the present invention is capable of minimizing the measurement errors caused by the periodic noise or the delayed noise associated with delay circuit under test.

What is claimed is:

1. A delay time measurement apparatus for measuring delay times in a delay circuit provided in a semiconductor test system for testing a semiconductor device, comprising:
    a voltage controlled oscillator whose oscillation frequency is controlled by a voltage supplied thereto;
    a phase comparator having two inputs for comparing a phase difference between signals at said two inputs, one of said inputs receiving an output of said voltage controlled oscillator through a delay circuit whose delay time is to be measured and the other input directly receiving said output of said voltage controlled oscillator;
    a phase lock loop having said voltage controlled oscillator and said phase comparator therein, said phase lock loop returning an output voltage of said phase comparator to said voltage controlled oscillator to control an oscillation frequency of said voltage controlled oscillator such that said phase difference between said two inputs of said phase comparator becomes zero;
    a signal adder for introducing an external signal into said phase lock loop for fluctuating said oscillation frequency, said external signal being a signal whose average voltage level for an integer multiple of one cycle is zero; and
    a counter for counting the said oscillation frequency of said voltage controlled oscillator.

2. A delay time measurement apparatus as defined in claim 1, wherein said counter counts said oscillation frequency of said voltage controlled oscillator during a gate time which is significantly longer than a period of said oscillation frequency or than an integer multiple of said one cycle of said external signal.

3. A delay time measurement apparatus as defined in claim 2, further comprising:
    a loop filter for defining a loop response characteristics of said phase lock loop, said loop response characteristics including a time constant of said phase lock loop which is sufficiently smaller than said one cycle of said external signal.

4. A delay time measurement apparatus as defined in claim 3, further comprising:
    a wave formatter provided between said voltage controlled oscillator and said delay circuit for shaping the output of said voltage controlled oscillator to a pulse signal having a constant pulse width.

5. A delay time measurement apparatus for measuring delay times in a delay circuit provided in a semiconductor test system for testing a semiconductor device, comprising:
    a voltage controlled oscillator whose oscillation frequency is controlled by a voltage supplied thereto;
    an extracting circuit connected to said voltage controlled oscillator for extracting a pair of pulses from the output of said voltage controlled oscillator in a desired interval, said pair of said pulses being two consecutive pulses in said output of said voltage controlled oscillator;
    a phase comparator having two inputs for comparing a phase difference between signals at said two inputs, one of said inputs receiving one of said two consecutive pulses extracted by said extracting circuit through a delay circuit whose delay time is to be measured and the other input directly receiving said the other pulse from said extracting circuit;
    a phase lock loop having said voltage controlled oscillator and said phase comparator therein, said phase lock loop returning an output voltage of said phase comparator to said voltage controlled oscillator to control an oscillation frequency of said voltage controlled oscillator such that said phase difference between said two inputs of said phase comparator becomes zero;
    a signal adder for introducing an external signal into said phase lock loop for fluctuating said oscillation frequency, said external signal being a signal whose average voltage level for an integer multiple of one cycle is zero; and
    a counter for counting the said oscillation frequency of said voltage controlled oscillator.

6. A delay time measurement apparatus as defined in claim 5, wherein extracting circuit includes a random signal generator so that said interval of extracting said pair of pulses is performed in a random sequence.

7. A delay time measurement apparatus as defined in claim 5, wherein said counter counts said oscillation frequency of said voltage controlled oscillator during a gate time which is significantly longer than a period of said oscillation frequency or than an integer multiple of said one cycle of said external signal.

8. A delay time measurement apparatus as defined in claim 7, further comprising:
    a loop filter for defining a loop response characteristics of said phase lock loop, said loop response characteristics including a time constant of said phase lock loop which is sufficiently smaller than said one cycle of said external signal.

9. A delay time measurement apparatus as defined in claim 8, further comprising:
    a wave formatter provided between said voltage controlled oscillator and said delay circuit for shaping the output of said voltage controlled oscillator to a pulse signal having a constant pulse width.

10. A delay time measurement apparatus for measuring delay times in a delay circuit provided in a semiconductor test system for testing a semiconductor device, comprising:
a voltage controlled oscillator whose oscillation frequency is controlled by a voltage supplied thereto;
a phase comparator having two inputs for comparing a phase difference between signals at said two inputs, one of said inputs receiving an output of said voltage controlled oscillator through a delay circuit whose delay time is to be measured and the other input directly receiving said output of said voltage controlled oscillator;
a phase lock loop having said voltage controlled oscillator and said phase comparator therein, said phase lock loop returning an output voltage of said phase comparator to said voltage controlled oscillator to control an oscillation frequency of said voltage controlled oscillator such that said phase difference between said two inputs of said phase comparator becomes zero;
a delay line connected between said voltage controlled oscillator and said phase comparator and having a known delay time;
a switch for alternately changing signal paths for periodically adding said known delay time of said delay line to said delay time of said delay circuit to be measured;
a signal adder for introducing an external signal into said phase lock loop for fluctuating said oscillation frequency, said external signal being a signal whose average voltage level for an integer multiple of one cycle is zero; and
a counter for counting the said oscillation frequency of said voltage controlled oscillator.

11. A delay time measurement apparatus as defined in claim 10, wherein said counter counts said oscillation frequency of said voltage controlled oscillator during a gate time which is significantly longer than a period of said oscillation frequency or than an integer multiple of said one cycle of said external signal.

12. A delay time measurement apparatus as defined in claim 11, further comprising:
a loop filter for defining a loop response characteristics of said phase lock loop, said loop response characteristics including a time constant of said phase lock loop which is sufficiently smaller than said one cycle of said external signal.

13. A delay time measurement apparatus as defined in claim 12, wherein a time period of said changing said signal paths by said switch is sufficiently longer than said time constant of said phase lock loop.

14. A delay time measurement apparatus as defined in claim 13, further comprising:
a wave formatter provided between said voltage controlled oscillator and said delay circuit for shaping the output of said voltage controlled oscillator to a pulse signal having a constant pulse width.

15. A delay time measurement apparatus for measuring delay times in a delay circuit provided in a semiconductor test system for testing a semiconductor device, comprising:
a voltage controlled oscillator whose oscillation frequency is controlled by a voltage supplied thereto;
a phase comparator having two inputs for comparing a phase difference between signals at said two inputs, one of said inputs receiving an output of said voltage controlled oscillator through a delay circuit whose delay time is to be measured and the other input directly receiving said output of said voltage controlled oscillator;
a phase lock loop having said voltage controlled oscillator and said phase comparator therein, said phase lock loop returning an output voltage of said phase comparator to said voltage controlled oscillator to control an oscillation frequency of said voltage controlled oscillator such that said phase difference between said two inputs of said phase comparator becomes zero;
a pair of delay lines connected between said voltage controlled oscillator and said phase comparator and having a known identical delay time with one another;
a pair of switches for alternately changing signal paths connected to said phase comparator for periodically adding said known delay time of said delay lines to said output of said voltage controlled oscillator to be received by both of said two inputs of said phase comparator;
a signal adder for introducing an external signal into said phase lock loop for fluctuating said oscillation frequency, said external signal being a signal whose average voltage level for an integer multiple of one cycle is zero; and
a counter for counting the said oscillation frequency of said voltage controlled oscillator.

16. A delay time measurement apparatus as defined in claim 15, wherein said pair of switches operate in parallel at the same time to insert said pair of delay lines in said signal paths at the same time.

17. A delay time measurement apparatus as defined in claim 15, wherein said counter counts said oscillation frequency of said voltage controlled oscillator during a gate time which is significantly longer than a period of said oscillation frequency or than an integer multiple of said one cycle of said external signal.

18. A delay time measurement apparatus as defined in claim 17, further comprising:
a loop filter for defining a loop response characteristics of said phase lock loop, said loop response characteristics including a time constant of said phase lock loop which is sufficiently smaller than said one cycle of said external signal.

19. A delay time measurement apparatus as defined in claim 18, wherein a time period of said changing said signal paths by said switch is sufficiently longer than said time constant of said phase lock loop.

20. A delay time measurement apparatus as defined in claim 19, further comprising:
a wave formatter provided between said voltage controlled oscillator and said delay circuit for shaping the output of said voltage controlled oscillator to a pulse signal having a constant pulse width.

* * * * *